United States Patent [19]

Yanagawa

[11] Patent Number: 5,287,367
[45] Date of Patent: Feb. 15, 1994

[54] APPARATUS FOR CONTROLLING SEMICONDUCTOR LASER

[75] Inventor: Naoharu Yanagawa, Tokorozawa, Japan

[73] Assignee: Pioneer Electronic Corporation, Tokyo, Japan

[21] Appl. No.: 883,153

[22] Filed: May 14, 1992

[30] Foreign Application Priority Data

May 27, 1991 [JP] Japan .................. 3-121331

[51] Int. Cl.[5] .............................. H01S 3/10
[52] U.S. Cl. ........................ 372/31; 372/32; 372/34; 372/36; 372/38
[58] Field of Search ............. 372/34, 36, 38, 32, 372/31, 29

[56] References Cited

U.S. PATENT DOCUMENTS

| | | | |
|---|---|---|---|
| 4,685,097 | 8/1987 | van der Put | 369/54 |
| 4,821,273 | 4/1989 | Hori | 372/34 |
| 4,834,477 | 5/1989 | Tomita et al. | 372/34 |
| 5,042,042 | 8/1991 | Hori et al. | 372/34 |

FOREIGN PATENT DOCUMENTS 0001714 2/1979 European Pat. Off. .
2190783 11/1987 United Kingdom .

OTHER PUBLICATIONS

Patent Abstracts of Japan JP2054979 (Mitsubishi Electric Corp).
Patent Abstracts of Japan JP60117695 (Sharp K.K.).
Patent Abstracts of Japan JP5655087 (Fujitsu K.K.).
Patent Abstracts of Japan JP58171880 (Canon K.K.).
Electronics Letters, vol. 15, No. 5; Feb. 1980; pp. 179-181 Hitchin; GB; T. Okoghi et al.

Primary Examiner—Georgia Y. Epps
Attorney, Agent, or Firm—Kane, Dalsimer, Sullivan, Kurucz, Levy, Eisele and Richard

[57] ABSTRACT

A semiconductor laser control apparatus is used for controlling a semiconductor laser as a light source in an optical pick-up device for optically reading information on an information recording medium. The semiconductor laser control apparatus carries out emission or absorption of heat with respect to a semiconductor laser emitting a laser beam by a temperature control element arranged adjacently to the semiconductor laser on the basis of a current delivered from the power supply.

11 Claims, 7 Drawing Sheets

F I G. 2
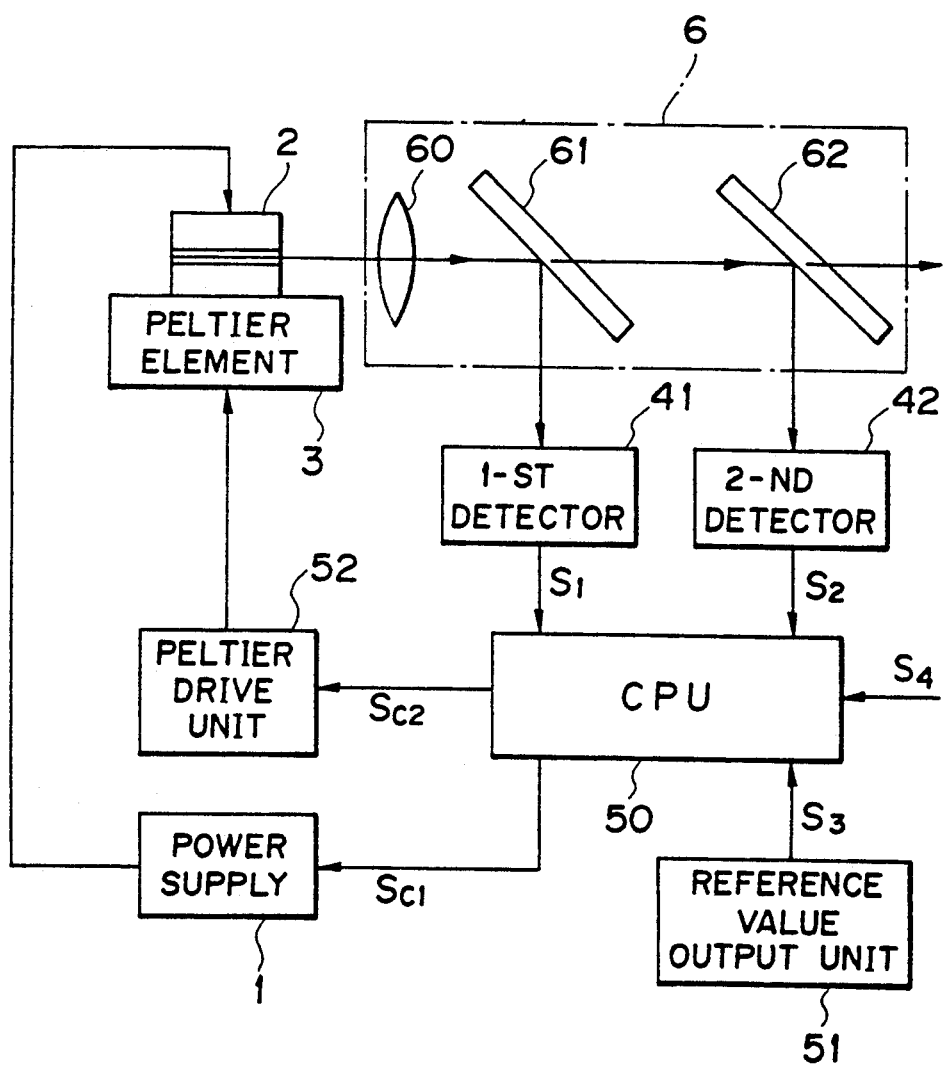

APPARATUS FOR CONTROLLING SEMICONDUCTOR LASER

BACKGROUND OF THE INVENTION

This invention relates to an apparatus for controlling a semiconductor laser used as a light source of various devices such as CD (Compact Disk) or LD (Laser Disk), etc.

An optical pick-up in which a semiconductor laser is used emits, onto a disc, laser beams respectively having intensities in conformity with those at the times of recording and reproduction to record information on the disc, and to reproduce the recorded information therefrom. At the time of the operation for recording information, a laser beam having a large light intensity is emitted from the optical pick-up onto the disc to record information on the disc. On the other hand, at the time of the operation for reproducing information, a laser beam having a light intensity smaller than that of a laser beam at the time of recording is emitted from the optical pick-up onto the disc to reproduce the recorded information on the basis of a signal light obtained so that the emitted laser beam is reflected on the disc surface. At the time of reproduction, by emitting, onto the disc, a laser beam at a maximum light intensity at which no information is recorded onto the disc, respective S/N ratios in a control signal of the servo system and a RF signal of the reproducing system is maintained at a sufficiently large value.

However, since the semiconductor laser is constructed as above to carry out the recording and reproducing operations, an oscillation spectrum might undesirably shift due to a difference between a light output at the time of recording and that at the time of reproduction.

In the case where the above-mentioned semiconductor laser is used as an optical pick-up, there may arise problems as described below due to the shift of the oscillation spectrum. First, when the optical system of the optical pick-up is constituted with a single spheric lens such as an aspherical lens, the focal position varies due to the shift of the oscillation spectrum. Secondly, when a prism for correcting the ellipsoidal emitting face of an outgoing beam of a laser beam emitted from the semiconductor laser is provided as an optical system, the laser beam varies in a certain direction by the shift of the oscillation spectrum. Thirdly, a laser beam is mode-hopped by the shift of the oscillation spectrum to generate noises. Fourthly, a laser beam intensity at the time of recording depends on a waveform in recording discs such as recordable CD (R-CD), etc. which uses coloring matter, so the laser beam undergoes the influence of the shift of the oscillation spectrum.

It is to be noted that in the case where an optical system in which the dispersion is small and the refractive index does not change even if the waveform shifts to any degree, such as an achromatic lens, etc. is used, there may take place a new problem such that the apparatus itself becomes expensive and large sized.

SUMMARY OF THE INVENTION

In order to solve the above-mentioned problems, this invention has been made, and its object is to provide an apparatus for controlling a semiconductor laser constructed so that a oscillation spectrum does not shift even if a light output of a laser beam emitted varies for any reason.

According to this invention, there is provided an apparatus for controlling a semiconductor laser, which comprises:

a semiconductor laser for generating and emitting a laser beam, a power supply for delivering, to the semiconductor laser, a current for generating a laser beam, a temperature control element arranged adjacently to the semiconductor laser, and for carrying out emission or absorption of heat with respect to the semiconductor laser, laser beam detection means for detecting a wavelength of a laser beam emitted from the semiconductor laser to output a detection signal, and temperature control means for controlling emission or absorption of heat by the temperature control element on the basis of the detection signal.

In this invention, an approach is employed to detect a wavelength of a laser beam emitted from the semiconductor laser to drive and control the temperature control element arranged adjacently to the semiconductor laser on the basis of the detected wavelength, whereby the temperature control element carries out emission or absorption of heat. Thus, it is possible to maintain the temperature of the semiconductor laser at a predetermined value. In this way, the oscilation wavelength of the semiconductor laser is maintained at a fixed value, e.g., irrespective of a difference between light outputs respectively required at the time of recorcing/reproduction by the optical pick-up.

BRIEF DESCRIPTION OF THE DRAWINGS

FIG. 2 is a block diagram showing the configuration of an apparatus for controlling a semiconductor laser according to a first embodiment of this invention.

DESCRIPTION OF THE PREFERRED EMBODIMENTS

Principle of this invention

Figure 1:
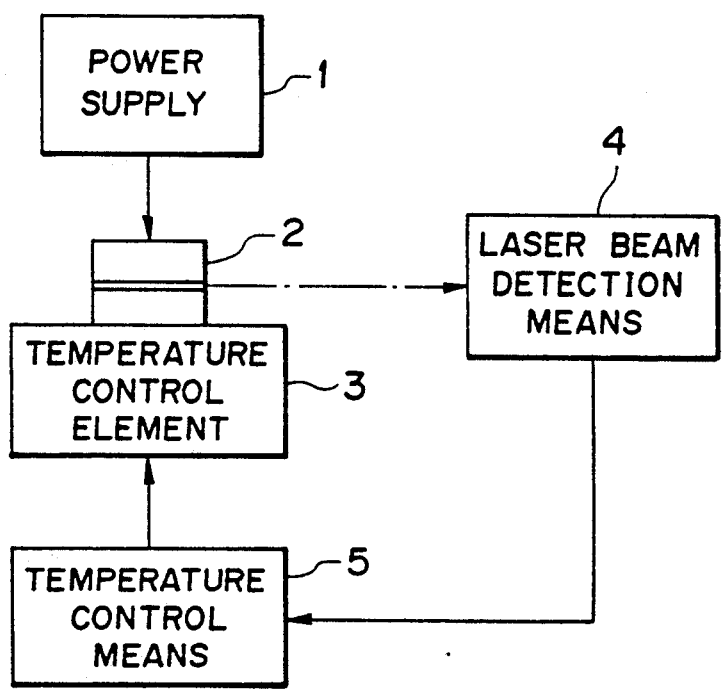
FIG. 1 is a block diagram showing the principle of an apparatus for controlling a semiconductor laser according to this invention.

The principle of this invention will now be described with reference to FIG. 1. In this drawing, a semiconductor laser control apparatus of this invention controls the intensity of a laser beam emitted from a semiconductor laser 2 to which a current is supplied from a power supply 1. This semiconductor laser control apparatus comprises a temperature control element 3 arranged adjacently to the semiconductor laser 2, and for carrying out emission or absorption of heat with respect to the semiconductor laser 2; laser beam detecion means 4 for detecting a wavelength of a laser beam emitted from the semiconductor laser 2 to output a detection signal; and temperature control means 5 for controlling emission or absorption of heat by the temperature control element 3 on the basis of the detection signal.

In this apparatus, a wavelength of a laser beam emitted from the semiconductir laser 2 is detected by the laser beam detection means 4 to drive and control the temperature control element 3 arranged adjacently to the semiconductor laser 2 on the basis of the detected wavelength, whereby the temperature control element 3 carries out emission or absorption of heat with respect to the semiconductor laser 2, thus making it possible to maintain the temperature of the semiconductor laser 2 at a predetermined value. Thus, the oscillation wavelength of the semiconductor laser 2 can be maintained at a fixed value. Particularly, in the case of recording/reproduction by the optical pick-up, it is possible to stably operate the semiconductor laser 2 irrespective of a difference between light outputs respectively required therefor.

First embodiment of this invention

FIG. 2 shows a case where the semiconductor laser control apparatus according to this invention is used as an optical pick-up of a recordable/reproducible optical player. The configuration of the apparatus of this embodiment is shown in a block form in FIG. 2. In this figure, the apparatus for controlling a semiconductor laser according to this embodiment comprises a semiconductor laser 2 for generating a laser beam on the basis of an applied voltage from a power supply 1; a Peltier element 3 arranged adjacently to the semiconductor laser 2 in order to carry out emission or absorption of a thermal energy in dependence on a quantity of a current delivered, an optical system 6 for carrying out converging, selection, transmission and reflection of an emitted laser beam from the semiconductor laser 2 to separate it into light beams of specific wavelengths to emit them; first and second detectors 41 and 42 adapted to detect laser beams emitted from the optical system 6 to detect wavelengths to output detection signals S1 and S2, respectively, a CPU 50 to which these detection signals S1 and S2 and a reference value signal S3 from a reference value output unit 51 are supplied to output a control signal Sc1 for the output control of the power supply 1 and a control signal Sc2 for the drive control of the Peltier element 3 on the basis of a recording/reproduction switching signal S4 from an operation unit (of which indication is omitted), and a Peltier drive unit 52 for delivering a predetermined current to the Peltier element 3 on the basis of the control signal Sc2.

More particularly, the optical system 6 comprises a collimator lens 60 for converting a diffused laser beam emitted from the semiconductor laser 2 to a parallel light; a filter 61 for allowing the laser beam of the parallel light to be reflected over the entire band of the wavelength of the laser beam, and allowing the beam having a specific wavelength to be transmitted therethrough and a half-mirror 62 for allowing the laser beam of the specific wavelength transmitted through the filter 61 to be transmitted and reflected to separate it into a transmitted light and a reflected light.

The operation of this embodiment based on the above configuration will now be described.

In a steady state either in the recording operation or in the reproducing operation, a laser beam from the semiconductor laser 2 is reflected over the entire band at the filter 61 through the collimator lens 60. As a result, the reflected laser beam of the entire band is detected by the first detector 41. The laser beam thus detected is outputted as a detection signal S1 to the CPU 50. This CPU 50 reads out, from the reference value output unit 51, a corresponding reference value signal S3 in accordance with the recording/reproducing operation of the recording/reproduction switching signal S4 to make a comparison between the reference value signal S3 and the detection signal S1 to output a control signal Sc1 to the power supply 1. This power supply 1 delivers a predetermined drive current to the semiconductor laser 2 on the basis of the control signal Sc1, thus allowing the semiconductor laser 2 to emit a stable laser beam.

In an initial transient state switched to either the recording operation or the reproducing operation, the CPU 50 outputs, to the power supply 1, a control signal Sc1 for increasing (at the time of the recording operation) or decreasing (at the time of the reproducing operation) a laser beam output from the semiconductor laser 2 in dependence on the content of the inputted recording/reproduction switching signal S4 (value corresponding to the operating state after switched). As a result, a drive current corresponding to the control signal Sc1 is delivered from the power supply 1 to the semiconductor laser 2. Thus, an increased or a decreased laser beam is emitted therefrom. During this operation, only a laser beam of a specific wavelength is transmitted by the filter 61, and is then detected by the second detector 42 through the half mirror 62.

Generally, when an output from the semiconductor laser 2 varies, the wavelength also shifts. Accordingly, when a laser beam of a specific wavelength transmitted through the filter 61 is decreased or increased, a quantity of light of a laser beam reflected from the half mirror 62 is also decreased or increased. Since the laser beam of the specific wavelength thus decreased or increased is incident onto the second detector 42, the value of a detection signal S2 outputted from the second detector 42 is also decreased or increased. Since the CPU 50 controls an increase or a decrease of a laser beam from the semiconductor laser 2, it can judge the direction in which the wavelength shifts on the basis of the decreased or increased state of the detection signals S1 and S2. Thus, the CPU 50 allows the Peltier element 3 to control the temperature of the semiconductor laser 2 so as to emit a laser beam which shifts in a direction opposite to the direction in which the judged wavelength shifts. Namely, the CPU 50 outputs a control signal Sc2 to the Peltier drive unit 52 on the basis of the direction in which the wavelength shifts. As a result, a predetermined current corresponding to the control signal Sc2 is delivered from the Peltier drive unit 52 to the Peltier element 3. Thus, the Peltier element 3 carries out emission or absorption of heat on the basis of a predetermined current value to thereby increase or decrease the temperature of the semiconductor laser 2 to control the wavelength of a laser beam emitted from the semiconductor laser 2.

Second embodiment of this invention

Figure 3:
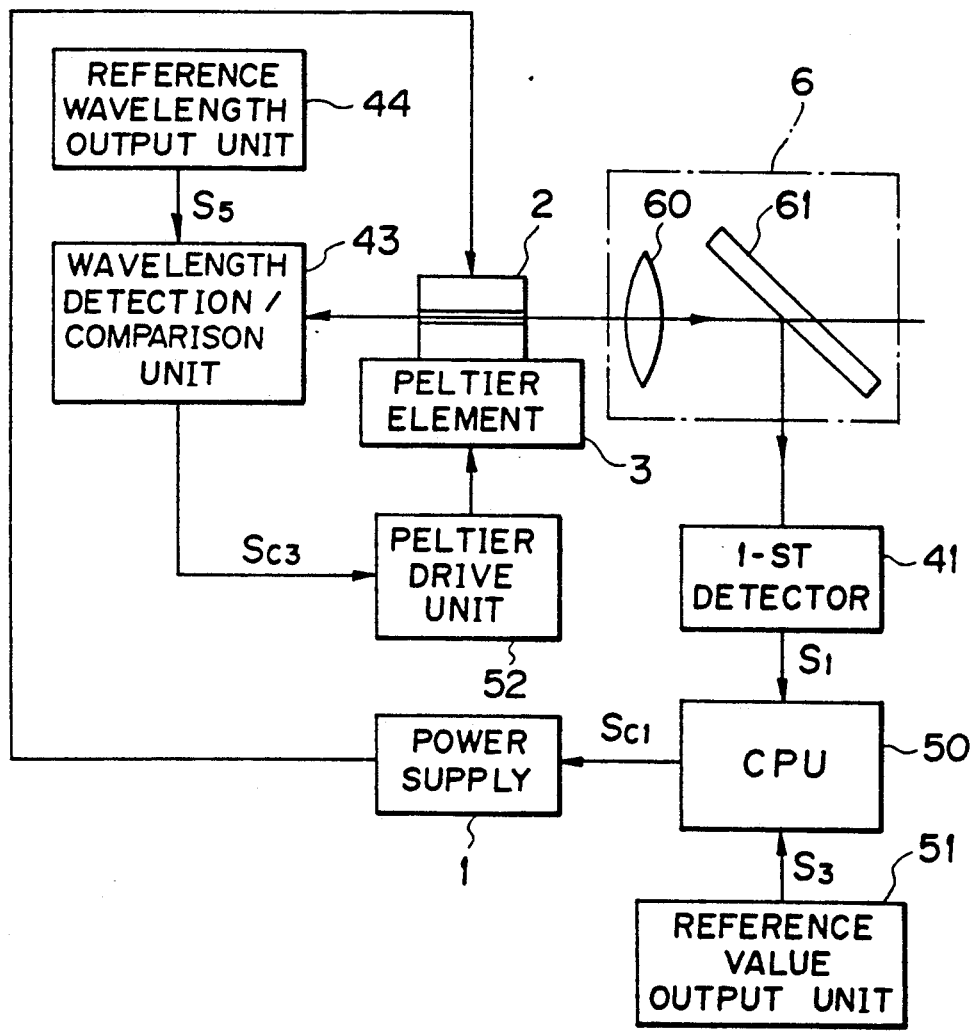
FIG. 3 is a block diagram showing the configuration of an apparatus for controlling a semiconductor laser according to a second embodiment of this invention.

A second embodiment of this invention will now be described with reference to FIG. 3. The configuration of an apparatus of this embodiment is shown in a block form in FIG. 3. In this figure, the semiconductor laser control apparatus according to this embodiment effects a control so that there is kept constant a laser beam emitted from the semiconductor laser 2 through the optical system 6, the first detector 41, the CPU 50 and the power supply 1 in the steady state of the recording or reproducing operation in the same manner as in the above-mentioned first embodiment (shown in FIG. 2). However, this embodiment differs from the first embodiment as follows. Namely, the configuration required for output of a control signal for controlling the Peltier element 3 and the Peltier drive unit 52 in the case where switching between the recording operation and the reproducing operation is carried out is different from that of the first embodiment.

The apparatus of this embodiment comprises a wavelength detection/comparison unit 43 for detecting a wavelength of a laser beam emitted from the semiconductor laser 2 in a backward direction to make a comparison between the detected wavelength and a reference wavelength of a reference value signal S5 to output a control signal Sc3; and a reference waveform output unit 44 for making a selection between two reference waveforms (reference wavelengths in two forms of the operation from recording to reproduction and the operation from reproduction to recording) as the reference value signal S5 to output a selected reference wavelength, thus to deliver a predetermined current from the Peltier drive circuit 52 to the Peltier element 3 on the basis of the control signal Sc3 to control the tempersture of the semiconductor laser 2.

The operation of this embodiment based on the above configuration will now be described. Initially, a backward laser beam emitted from a backward cleavage plane on the back side of the semiconductor laser 2 is detected at the wavelength detection/comparison unit 43. This wavelength detection/comparison unit 43 compares a wavelength of the detected laser beam with a reference value signal S5 outputted from the reference wavelength output unit 44 to judge the direction in which the wavelength shifts in the same manner as in the above described embodiment to output such a control signal Sc3 to emit a laser beam to shift in a direction opposite to that of the shift direction. As a result, a current of a predetermined value corresponding to the Peltier element 3 is delivered from the Peltier drive unit 52 on the basis of the control signal Sc3. Thus, the wavelength of a laser beam emitted from the semiconductor laser 2 can be controlled.

Figure 4:
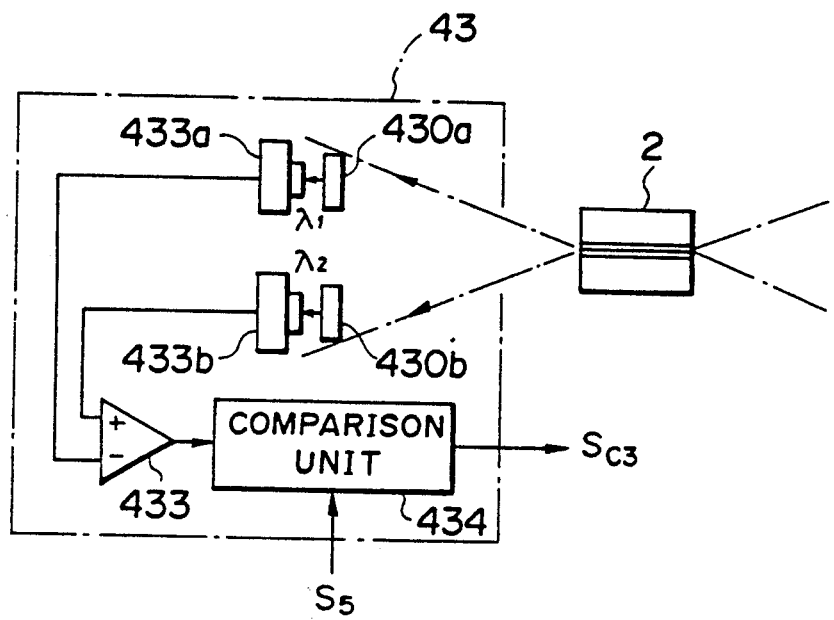
FIG. 4 is a block diagram showing the detail of a wavelength detection/comparison unit in an apparatus according to the second embodiment of this invention.

The wavelength detection/comparison unit 43 in the embodiment comprises, as shown in FIG. 4, two filters 430a and 430b adapted to receive backward emission laser beams of the semiconductor laser 2 to allow laser beams having different wavelengths $\lambda_1$ and $\lambda_2$ to be transmitted therethrough; two photo-diodes 433a and 433b adapted to detect laser beams respectively emitted from the two filters 430a and 430b to apply photo electric conversion thereto; an operation or calculation unit 433 for calculating a difference between respective electric signals outputted from the two photo-diodes 433a and 433b; and a comparison unit 434 for comparing a difference signal outputted from the calculation unit 433 with a reference value signal S5 to output a control signal Sc3. In this way, by the difference of the calculated result outputted from the calculation unit 433 (e.g., a positive value when the wavelength shifts in a direction where it takes a large value, and a negative value when the wavelength shifts in a direction where it takes a small value), it is possible to judge the shift direction of the wavelength, and to make a comparison between the difference sigal of calculated result and the reference value signal to determine the magnitude of a current value delivered to the Peltier element 3, thus to output a control signal Sc3 for specifying the shift direction and the magnitude of the current value.

Figure 5:
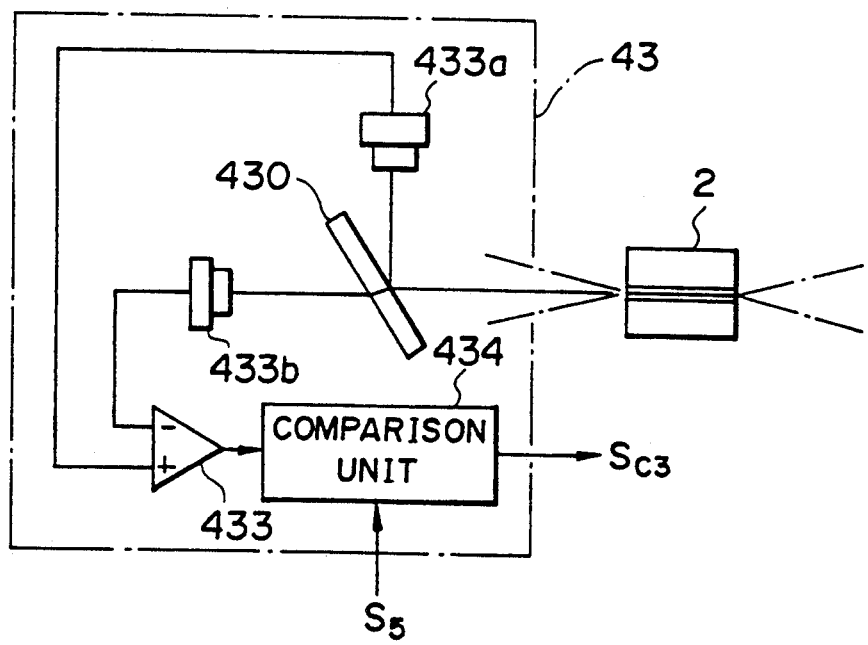
FIG. 5 is a block diagram showing the detail of another wavelength detection/comparison unit.

Further, the wavelength detection/comparison unit 43 is also shown in FIG. 5 in which two filters 430a and 430b of the embodiment shown in FIG. 4 is constructed as a single filter 430, and the laser beams reflected from and transmitted through the filter 430 are detected by two photodiodes 433a and 433b.

Figure 6:
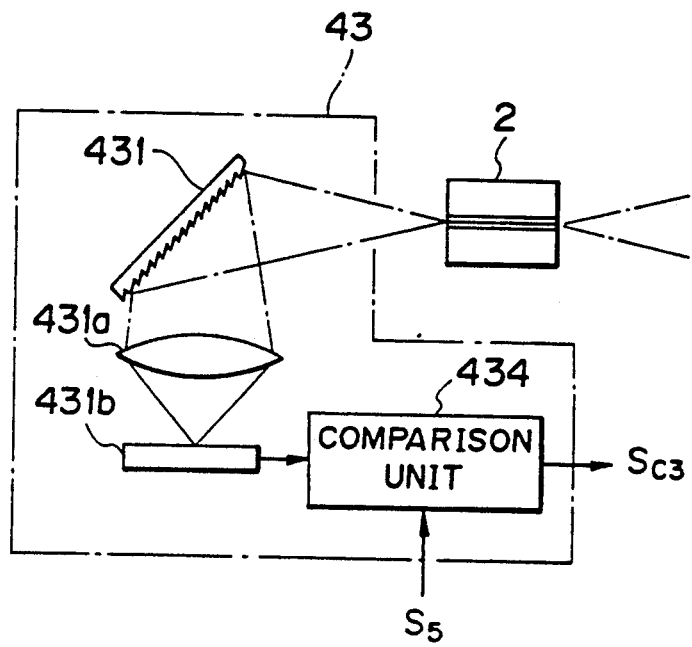
FIG. 6 is a block diagram showing the detail of still another wavelength detection/comparison unit.

The wavelength detection/comparison unit 43 in the embodiment shown in FIG. 6 comprises a reflective diffraction grating 431 adapted to receive a backward emission laser beam of the semiconductor laser 2 to reflect it; a converging lens 431a for allowing a laser beam reflected and diffracted to be a convergent laser beam; a line sensor 431b arranged, at a focal plane of the converging lens 431a, in such a manner that the irradiation position and the wavelength of a convergent laser beam are respectively correspond to each other; and a comparison unit 434 for making a comparison between an output from the line sensor 431b and a reference value signal S5 to output a control signal Sc3. As stated above, since the reflective diffraction angle of the reflective diffraction grating 431 varies in dependence on a difference between wavelength of laser beams emitted from the semiconductor laser 2, the position at which a laser beam is irradiated to the line sensor 431b varies. Thus, the shift direction of the wavelength can be discriminated. Further, a current value delivered to the Peltier element can be determined on the bases of comparison between an output value from the line sensor 431b and the reference value signal S5. Then, a control signal Sc3 for respectively specifying the shift direction and the current value is outputted from the comparison unit 434 to the Peltier drive unit 52 to control the wavelength of a laser beam emitted from the semiconductor laser 2.

Figure 7:
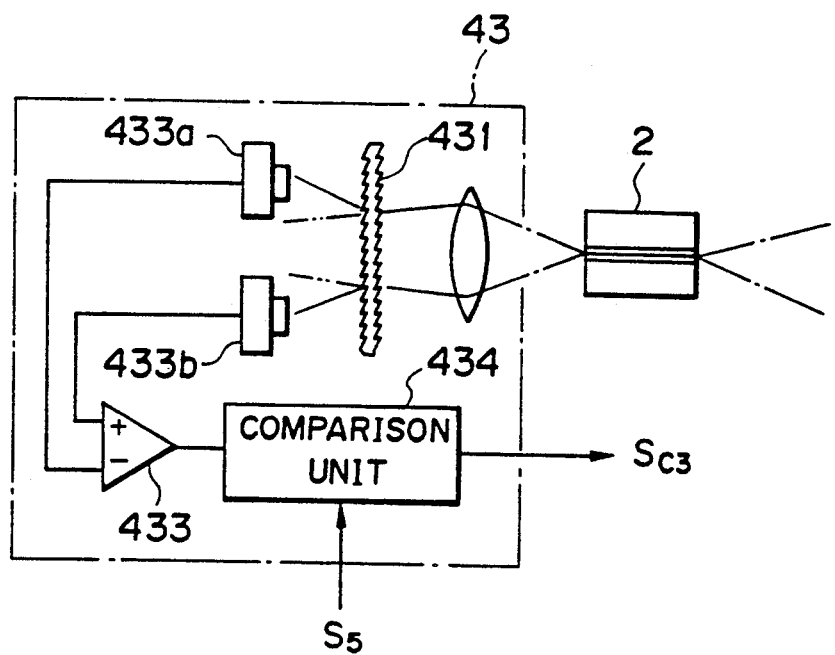
FIG. 7 is a block diagram showing the detail of still another wavelength detection/comparison unit.

The wavelength detection/comparison unit 43 shown in FIG. 7 is of a structure such that laser beams emitted at a diffraction angle varying in dependence on wavelength at a transmissive diffraction grating 431 are detected by two photo-diodes 433a and 433b.

Figure 8:
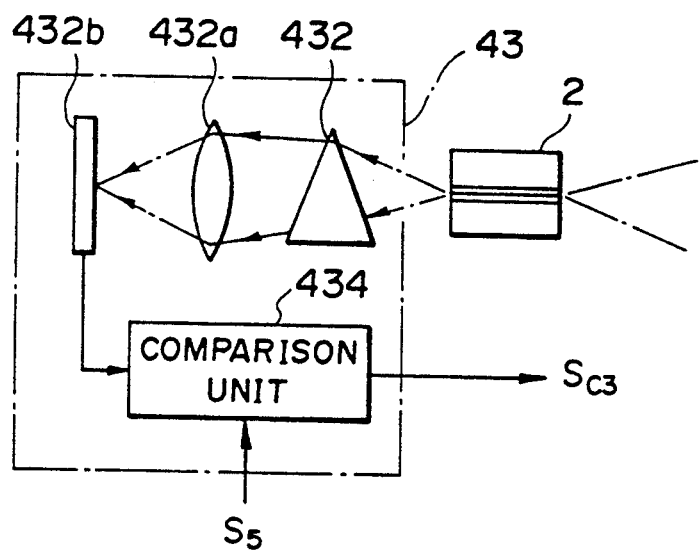
FIG. 8 is a block diagram showing the detail of still another wavelength detection/comparison unit.

The wavelength detection/comparison unit 43 shown in FIG. 8 is of a structure such that a prism 432 and a converging lens 432a are arranged in place of the relective diffraction grating 431 shown in FIG. 6. Since the prism 432 is such that the deflection angle varies in dependence on a difference between wavelengths of laser beams, the irradiation position of the line sensor 432b changes. Thus, the shift direction of the wavelength can be discriminated.

Figure 9:
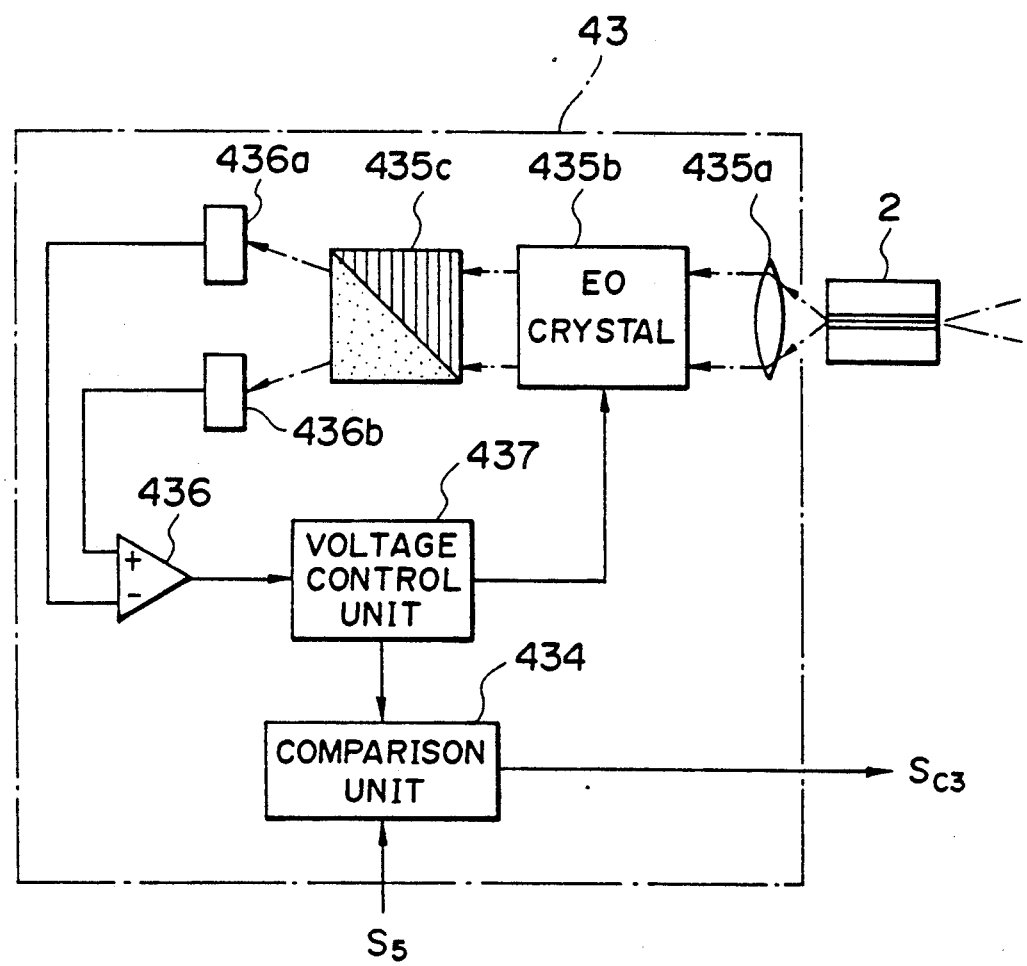
FIG. 9 is a block diagram showing the detail of still another wavelength detection/comparison unit.

In addition, the wavelength detection/comparison unit 43 shown in FIG. 9 comprises an electro optic crystal (EO crystal) 435b for emitting a circularly polarized laser beam which is obtained in a manner that the ordinary ray component (or the extraordinary ray component) in a linearly polarized laser beam emitted from the backward cleavage plane of the semiconductor laser 2 through a collimator lens 435a is shifted by $\lambda/2$; a Wollaston prism 435c by which the circularly polarized laser beam incident thereonto is separated into an ordinary ray component and an extraordinary ray component to emit them; photo-diodes 436a and 436b for detecting the respective separated laser beams to apply photo electric conversion thereto; an operation or calculation unit 436 for calculating a difference between respective electric signals outputted from the photo-diodes 436a and 436b; a voltage control unit 437 for outputting, to the EO crystal 435b, such a voltage to allow a difference signal outputted from the operation unit 436 to have "0" level, and a comparison unit 434 for comparing an output from the voltage control unit 437 with a reference value signal S5 to output a control signal Sc3.

In order to allow a laser beam emitted from the EO crystal 435b to be a circularly polarized laser beam, it is required to apply a half-wave voltage $V\pi$ to the EO crystal 435b. Namely, this half-wave voltage $V\pi$ is a voltage applied to the EO crystal 435b for allowing a linearly polarized laser beam emitted from the semiconductor laser 2 to be a circularly polarized laser beam. This half wave voltage V is expressed as follows:

$$V\pi = \lambda \times d/(ne^3 \times rc \times l) \qquad (1)$$

where $\lambda$ is a wavelength of a laser beam, d is a crystal thickness of the EO crystal, l is a crystal lengh of the EO crystal, ne is a refractive index of an extraordinary ray component in a laser beam, and rc is a Pockels constant.

In the above equation (1), because d, l, ne and rc are constants, respectively, the partial expression A expressed as $(d/ne^3 \times rc \times l)$ becomes constant. Thus, the following relationship holds:

$$V\pi = A \times \lambda \qquad (2)$$

Since a circularly polarized laser beam is incident from the EO crystal 435a onto the Wollaston prism 435c, light quantities of laser beams separated into an ordinary ray and an extraordinary ray by the Wollaston prism 435c are equal to each other. Thus, by controlling the half wave voltage $V\pi$ so that respective electric signals from the photo-diodes 436a and 436b are equal to each other, it is possible to judge the wavelength in accordance with the above equation (2). Thus, the shift direction can be recognized.

The invention may be embodied in other specific forms without departing from the spirit or essential characteristics thereof. The present embodiments are therefore to be considered in all aspects as illustrative and not restrictive, the scope of the invention being indicated by the appended claims rather than by the foregoing description and all changes which come within the meaning and range of equivalency of the claims are therefore intended to be embraced therein.

What is claimed is:

1. An apparatus for controlling a semiconductor laser comprising:
   a semiconductor laser for generating and emitting a laser beam;
   a power supply for delivering, to said semiconductor laser, a current for generating a laser beam;
   a temperature control element arranged adjacently to said semiconductor laser for carrying out emission on absorption of heat with respect to said semiconductor laser;
   laser beam detection means for detecting wavelength of a laser beam emitted from said semiconductor laser to output a detection signal; and
   temperature control means for controlling emission or absorption of heat by said temperature control element on the basis of the detection signal, said laser beam detection means comprising:
   a filter for transmitting only a light beam of a specific wavelength;
   a first detector for detecting a laser beam reflected by the filter and outputting a first detection signal; and
   a second detector for detecting a laser beam transmitted through the filter and outputting a second detection signal, wherein said temperature control means discriminates a shift of wavelength of the laser beam emitted from said semiconductor laser based on changes of the first detection signal and the second detection signal, and said temperature control means controls the temperature control element on the basis of the shift of the wavelength.

2. An apparatus as set forth in claim 1, wherein said temperature control element is formed by a Peltier element, a predetermined current being delivered from said temperature control means to said Peltier element on the basis of a detection signal.

3. An apparatus for controlling a semiconductor laser comprising:
   a semiconductor laser for generating and emitting a laser beam;
   a power supply for delivering, to said semiconductor laser, a current for generating a laser beam;
   a temperature control element arranged adjacently to said semiconductor laser for carrying out emission or absorption of heat with respect to said semiconductor laser;
   laser beam detection means for detecting wavelength of a laser beam emitted from said semiconductor laser to output a detection signal; and
   temperature control means for controlling emission or absorption of heat by said temperature control element on the basis of the detection signal, said laser beam detection means includes a wavelength detection/comparison unit for detecting a wavelength of a laser beam emitted from a backward cleavage plane of said semiconductor laser and comparing a wavelength of the detected laser beam with a reference wavelength.

4. An apparatus as set forth in claim 3, wherein said wavelength detection/comparison unit comprises:
   a plurality of filters to receive a laser beam emitted from said semiconductor laser to emit laser beams having different wavelength to be transmitted therethrough;
   a plurality of photo-diodes to detect said laser beams emitted from said plurality of filters to apply photo-electric conversion thereto;
   a calculation unit for calculating a difference between respective electric signals from said plurality of photodiodes; and
   a comparison unit for making a comparison between a calculated result by said calculation unit and a reference value set in advance to output a control signal to control said temperature control means.

5. An apparatus as set forth in claim 3, wherein said wavelength detection/comparison unit comprises:
   a filter for reflecting and transmitting the laser beam emitted from said semiconductor laser;
   two photo-diodes to detect a reflected laser beam and a transmitted laser beam, respectively;
   a calculation unit for calculating a difference between respective electric signals from the photo-diodes; and a comparison unit for making a comparison between a calculated result by said calculation unit and a reference value set in advance to output a control signal to control said temperature control means.

6. An apparatus as set forth in claim 3, wherein said wavelength detection/comparison unit comprises:
spectral means for emitting a laser beam from the backward cleavage plane of said semiconductor laser at an emission angle varying in correspondence with a wavelength of said laser beam;
photodetector means adapted to detect a laser beam emitted from said spectral means at positions varying in dependence on the wavelength thereof; and
a comparison unit for making a comparison between an output from said photodetector means and a reference value set in advance to output a control signal to control said temperature control means.

7. An apparatus as set forth in claim 6, wherein said spectral means comprises a reflective diffraction grating, and said photodetector means comprises a line sensor.

8. An apparatus as set forth in claim 6, wherein said spectral means comprises a prism and a converging lens, and said photodetector means comprises a line sensor.

9. An apparatus as set forth in claim 3, wherein said wavelength detection/comparison unit comprises:
a transmissive diffraction grating for transmitting and diffracting the laser beam from the semiconductor laser therethrough;
a plurality of photo-diodes to detect the laser beams emitted from the transmissive diffraction grating,
a calculation unit for calculating a difference between respective electric signals from said plurality of photodiodes; and a comparison unit for making a comparison between a calculated result by said calculation unit and a reference value set in advance to output a control signal to control said temperature control means.

10. An apparatus as set forth in claim 1, wherein said wavelength detection/comparison unit comprises:
an electro optic crystal for emitting a circularly polarized laser beam in such a manner that an ordinary ray component or extraordinary ray component in a linearly polarized laser beam emitted from the backward cleavage plane of said semiconductor laser is shifted by $\lambda/2$;
a Wollastone prism for separating said circularly polarized laser beam into an ordinary ray component and an extraordinary ray component to emit them;
photo-diodes for detecting said respective separated laser beams to apply photo electric conversion thereto;
a calculation unit for calculating a difference between respective electric signals outputted from said photodiodes;
a voltage control unit for outputting, to said electro optic crystal, such a voltage to allow a difference signal outputted from said calculation unit to have "0" level; and
a comparison unit for comparing an output from said voltage control unit with a reference value set in advance to output a control signal.

11. An apparatus as set forth in claim 1, wherein said semiconductor laser is a light source of an optical pickup for recording information onto a recording medium and reproducing it therefrom.

* * * * *